United States Patent
Gearhardt et al.

(10) Patent No.: US 7,272,763 B2
(45) Date of Patent: Sep. 18, 2007

(54) BUILT-IN SELF TEST CIRCUITRY FOR PROCESS MONITOR CIRCUIT FOR RAPIDCHIP AND ASIC DEVICES

(75) Inventors: Kevin Gearhardt, Fort Collins, CO (US); Anita Greeb, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 214 days.

(21) Appl. No.: 10/954,906

(22) Filed: Sep. 30, 2004

(65) Prior Publication Data

US 2006/0069968 A1    Mar. 30, 2006

(51) Int. Cl.
*G01R 31/28* (2006.01)
*G06F 11/00* (2006.01)

(52) U.S. Cl. .................. 714/733; 714/745

(58) Field of Classification Search .......... 714/721, 714/724, 737, 745; 324/158.1, 606, 647, 324/73.1, 763; 326/31, 35
See application file for complete search history.

(56) References Cited

U.S. PATENT DOCUMENTS

| | | | |
|---|---|---|---|
| 6,751,566 B2* | 6/2004 | Sugai | 702/70 |
| 6,937,051 B2* | 8/2005 | Eichin et al. | 324/765 |
| 7,069,488 B2* | 6/2006 | Moll et al. | 714/736 |
| 7,084,658 B2* | 8/2006 | Saitou et al. | 324/763 |
| 7,085,979 B2* | 8/2006 | Kim et al. | 714/734 |
| 7,091,728 B2* | 8/2006 | Drouin et al. | 324/713 |

FOREIGN PATENT DOCUMENTS

RU    2017333 C    *    7/1994

* cited by examiner

*Primary Examiner*—Cynthia Britt
(74) *Attorney, Agent, or Firm*—Trexler, Bushnell, Giangiorgi, Blackstone & Marr, Ltd.

(57) ABSTRACT

A test circuitry approach which addresses the shortcoming associated with current process monitor circuitry. The approach provides a means of testing that can be employed in association with any and all tester platforms. On-chip built-in self test (BIST) circuitry is added to the design that analyzes the 10-bit value captured from the counter, and indicates to the ATE via a single pin at a single test vector location whether or not the device has passed its test limits. An alternative solution is to use the digital capture circuitry on a mixed-signal tester to capture the non-deterministic digital word generated by the process monitor circuitry, and then test that result against the desired test limits.

17 Claims, 1 Drawing Sheet

BUILT-IN SELF TEST CIRCUITRY FOR PROCESS MONITOR CIRCUIT FOR RAPIDCHIP AND ASIC DEVICES

BACKGROUND

The present invention generally relates to the use of a process monitor circuit for critical-path testing for Rapid-Chip® and ASIC devices, and more specifically relates to built-in self test circuitry for use with a process monitor circuit for RapidChip® and ASIC devices.

The existing process monitor circuit for RapidChip® and ASIC devices utilizes a gated ring oscillator to drive a counter. By gating the oscillator for a known period of time, the resultant 10-bit value of the counter provides an indication of the speed of the ring oscillator. This 10-bit value is then shifted off-chip through a device output pin for analysis by the tester to determine whether the device falls within the manufacturing process window. Since the 10-bit value which is generated is non-deterministic, meaning it can have a wide range of acceptable values, this approach requires that the automated test equipment (ATE) capture the serial data from the device-under-test (DUT) and convert it to a number which can then be tested for a pass/fail condition. In cases where the 10-bit value must be retained for further use in the manufacturing test flow, this approach is the only method that will work. However, in a situation where the 10-bit value need only be tested to pass/fail limits, the aforementioned approach is not ideal in that a typical ATE is not designed to test digital words per se.

The disadvantage of the existing solution is that the tester platforms capable of digital capture are very limited, both in system availability and with respect to the tester pin count of such a tester.

OBJECTS AND SUMMARY

An object of an embodiment of the present invention is to provide test circuitry which addresses the shortcoming associated with current process monitor circuitry.

Another object of an embodiment of the present invention is to provide a means of testing that can be employed in association with any and all tester platforms.

Briefly, and in accordance with at least one of the foregoing objects, an embodiment of the present invention addresses the shortcoming of the current process monitor circuitry by adding on-chip built-in self test (BIST) circuitry to the design that analyzes the 10-bit value captured from the counter, and indicates to the ATE via a single pin at a single test vector location whether or not the device has passed its test limits.

An alternative solution to this problem is to use the digital capture circuitry on a mixed-signal tester to capture the non-deterministic digital word generated by the process monitor circuitry, and then test that result against the desired test limits.

BRIEF DESCRIPTION OF THE DRAWING

The organization and manner of the structure and operation of the invention, together with further objects and advantages thereof, may best be understood by reference to the following description, taken in connection with the accompanying drawing, wherein.

DESCRIPTION

Figure 1:
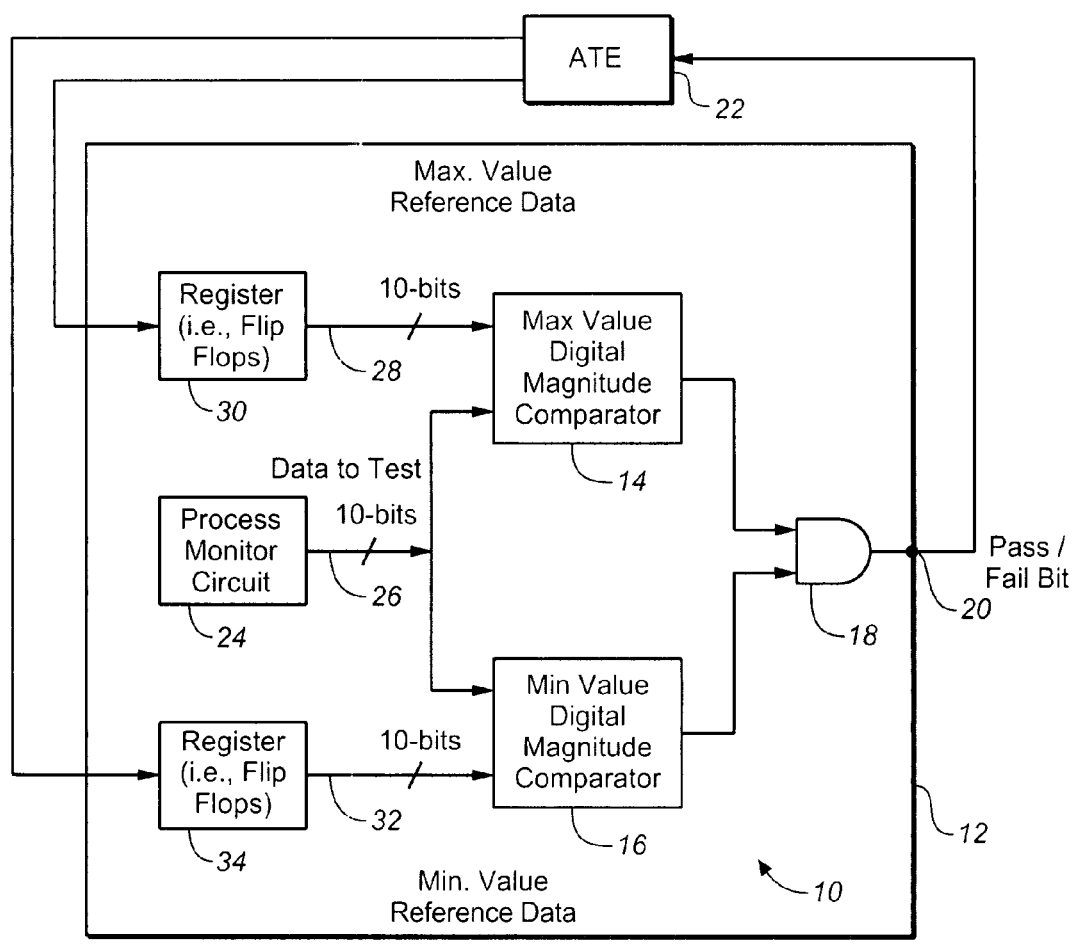
FIG. 1 is a circuit diagram of built-in self test circuitry which is in accordance with an embodiment of the present invention.

While the invention may be susceptible to embodiment in different forms, there is shown in the drawing, and herein will be described in detail, a specific embodiment of the invention. The present disclosure is to be considered an example of the principles of the invention, and is not intended to limit the invention to that which is illustrated and described herein.

FIG. 1 illustrates built-in self test (BIST) circuitry 10 which is in accordance with an embodiment of the present invention. The circuitry can be used with any and all tester platforms, and addresses the shortcoming associated with current process monitor circuitry.

The circuitry is on-chip (i.e., on a RapidChip®, ASIC, etc. 12) and includes a maximum value digital magnitude comparator 14 and a minimum value digital magnitude comparator 16. Outputs from the comparators 14, 16 are connected to an AND gate 18, and the output from the AND gate 18 is connected to a pin 20 which is connected to the ATE 22 (thereby providing a pass/fail bit to the ATE). A process monitor circuit 24 is connected to the comparators 14, 16 and the 10-bit output of the process monitor circuit (i.e., the data to test 26) is provided to the comparators 14, 16.

In addition to receiving the data to test 26 from the process monitor circuit 24, the comparators 14, 16 receive reference data. Specifically, the maximum value digital magnitude comparator 14 receives maximum value reference data 28 from a register 30 (preferably comprised of flip flops), and the minimum value digital magnitude comparator 16 receives minimum value reference data 32 from a register 34 (also preferably comprised of flip flops). Preferably, the registers 30, 34 are programmed by the ATE 22 and its supplied test vectors during the test operation. The process monitor circuit 24, comparators 14, 16, AND gate 18 and registers 30, 34 are all on-chip 12.

The present invention addresses the shortcoming of current process monitor circuitry by adding on-chip built-in self test (BIST) circuitry 10 to the design that analyzes the 10-bit value (26) captured from the process monitor circuit 24, and indicates to the ATE 22 via a single pin 20 at a single test vector location whether or not the device has passed its test limits.

The present invention provides a solution to the aforementioned problem of testing a non-deterministic n-bit word by adding circuitry 10 to the actual design which provides a BIST approach to testing. Specifically, once the process monitor circuit 24 has generated its 10-bit digital word (26) representing the performance of the DUT, that 10-bit value is supplied as input data to the two digital magnitude comparators 14, 16 which are implemented in logic on the device 12. One of the magnitude comparators 14 checks to see if the 10-bit word (26) is less than or equal to its reference input value 28, while the other magnitude comparator 16 checks to see if the 10-bit word (26) is greater than or equal to its reference input value 32. This provides the desired test limit window needed to make a pass/fail decision relative to the DUT. As mentioned, these digital magnitude comparators 14, 16 receive their reference input values 28, 32 from an on-chip register 30, 34 comprised of flip-flops which are programmed by the ATE 22 and its supplied test vectors during the test operation. Thus, as every device is tested, it is receiving its test limits on-the-fly. The test limits can easily be derived based on prior characterization of silicon from a given process technology just as they are for the current process monitor test solution. For any given product to be tested, these test limits can be altered as needed to provide tighter control over test limits in situations where a specific product requires special processing.

The primary feature of the present invention is the ability to provide an on-chip go/no-go test solution for a process monitor circuit, without the need for shifting out the circuit's digital word for further analysis by the ATE. The present invention provides a simple solution for testing non-deterministic digital words against minimum and maximum limits, without having to bring the data off chip for analysis and testing by the ATE. The testing takes place within the device itself based on predetermined limits which are shifted into the device by the ATE during testing, where digital magnitude comparators make the pass/fail decision and provide a single bit of data to indicate the results.

Any test application which requires the analysis or testing of non-deterministic digital words could benefit from the use of the present invention. For example, a temperature sensor circuit which generates an n-bit digital value could be tested in a similar fashion by having the minimum and maximum test limits shifted into the design and having the BIST circuit perform the test.

An alternative solution to this problem is to use the digital capture circuitry on a mixed-signal tester to capture the non-deterministic digital word generated by the process monitor circuitry, and then test that result against the desired test limits.

While embodiments of the present invention are shown and described, it is envisioned that those skilled in the art may devise various modifications of the present invention without departing from the spirit and scope of the appended claims.

What is claimed is:

1. Test circuitry for testing the n-bit digital output of a digital output circuit and communicating the result of the test to an external circuit, said test circuitry comprising: a first comparator connected to the output of said digital output circuit and configured to test whether the output exceeds a first alterable reference value; a second comparator connected to the output of said digital output circuit and configured to test whether the output is less than a second alterable reference value, said test circuitry configured to assess the outputs of the first and second comparators and communicate the result of the test to the external circuit in the form of a single bit, wherein said first and second alterable reference values are configured to be alterable as a result of signals received from the external circuit.

2. Test circuitry as recited in claim 1, wherein the digital output circuit comprises a process monitor circuit.

3. Test circuitry as recited in claim 1, wherein the external circuit comprises ATE.

4. Test circuitry as recited in claim 1, further comprising a gate having an output connectable to the external circuit, wherein outputs of said first comparator and said second comparator are connected to the gate.

5. Test circuitry as recited in claim 4, wherein the gate is configured to receive the outputs of the first and second comparators and communicate the result of the test to the external circuit.

6. Test circuitry as recited in claim 5, wherein the output of the gate is connected to a pin and the pin is connectable to the external circuit, wherein the gate communicates the result of the test through the pin to the external circuit.

7. Test circuitry as recited in claim 4, wherein the gate comprises an AND gate.

8. Test circuitry as recited in claim 1, further comprising a register connected to inputs of each comparator.

9. Test circuitry as recited in claim 8, wherein the register is connectable to the external circuit and is configured to be programmed by the external circuit.

10. Test circuitry as recited in claim 1, wherein the digital output circuit comprises a process monitor circuit on an integrated circuit, wherein said first and said comparators are on-chip with the process monitor circuit.

11. Test circuitry on an integrated circuit for testing the n-bit digital output of a process monitor circuit on the integrated circuit and communicating the result of the test to ATE, said test circuitry comprising: a first comparator connected to the n-bit digital output of said process monitor circuit and configured to test whether the output exceeds a first alterable reference value; a second comparator connected to the n-bit digital output of said process monitor circuit and configured to test whether the output is less than a second alterable reference value, said test circuitry configured to assess the outputs of the first and second comparators and communicate the result of the test to the ATE in the form of a single bit, wherein said first and second alterable reference values are configured to be alterable as a result of signals received from the ATE.

12. Test circuitry as recited in claim 11, further comprising a gate having an output connectable to the ATE, wherein outputs of said first comparator and said second comparator are connected to the gate.

13. Test circuitry as recited in claim 12, wherein the gate is configured to receive the outputs of the first and second comparators and communicate the result of the test to the ATE.

14. Test circuitry as recited in claim 13, wherein the output of the gate is connected to a pin and the pin is connectable to the ATE, wherein the gate communicates the result of the test through the pin to the ATE.

15. Test circuitry as recited in claim 11, wherein the register is connectable to the ATE and is configured to be programmed by the ATE.

16. Test circuitry as recited in claim 12, wherein the gate comprises an AND gate.

17. Test circuitry as recited in claim 16, further comprising a register connected to inputs of each comparator.

* * * * *